United States Patent
Hyland et al.

(10) Patent No.: US 6,702,618 B1
(45) Date of Patent: Mar. 9, 2004

(54) MODULAR JACK HAVING IMPROVED GROUNDING PLATE

(75) Inventors: James H. Hyland, Hummelstown, PA (US); Kevin E. Walker, Hershey, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/280,209

(22) Filed: Oct. 24, 2002

(51) Int. Cl.[7] .................. H01R 13/66; H01R 13/648
(52) U.S. Cl. ................ 439/620; 439/609; 439/676
(58) Field of Search .................. 439/620, 676, 439/607, 66, 74, 490, 344, 609, 95, 96

(56) References Cited

U.S. PATENT DOCUMENTS

| | | | |
|---|---|---|---|
| 5,069,641 A | 12/1991 | Sakamoto et al. | |
| 6,238,247 B1 * | 5/2001 | Belopolsky et al. | 439/620 |
| 6,328,603 B1 * | 12/2001 | Chang | 439/620 |
| 6,450,837 B1 * | 9/2002 | Givens et al. | 439/620 |

* cited by examiner

Primary Examiner—Son V. Nguyen
(74) Attorney, Agent, or Firm—Wei Te Chung

(57) ABSTRACT

A modular jack (100) in accordance with the present invention includes an insulative housing (1) defines a cavity for receiving a plug connector, a conductive shield (2) substantially surrounding the insulative housing and a module assembly (10) installed in the cavity of the insulative housin. The module assembly includes a magnetic module (3), a first printed circuit board (PCB, 4), a second PCB (5), and a grounding plate (9). A contact array (6) is soldered to the first PCB. The first PCB is attached on a bottom wall (312) of the magnetic module. The second PCB carries capacitors and resistors and a pair of light emitting diodes (LEDs 501, 502) soldered on a front portion thereof. The second PCB is disposed off from a top wall (311) of the magnetic module. The magnetic module defines a passageway (38) and the grounding plate has a flat portion (90) received therein.

7 Claims, 5 Drawing Sheets

MODULAR JACK HAVING IMPROVED GROUNDING PLATE

CROSS-REFERENCE TO RELATED APPLICATION

The present application is related to commonly assigned and contemporaneously filed U.S. patent applications, entitled "MODULAR JACK HAVING RETENTION MECHANISM", invented by James H. Hyland et al., entitled "MODULAR JACK HAVING SUBASSEMBLY OF PCBS AND MAGNETIC BOX", invented by Kevin E. Walker et al.; Ser. No. 10/005,962, filed on Nov. 7, 2001, entitled "RJ MODULAR CONNECTOR HAVING GROUNDING MECHANISM", Ser. No. 10/040,754, filed on Dec. 28, 2001, entitled "ANTI CROSSTALK ELECTRICAL CONNECTOR AND METHOD OF MANUFACTURE THE SAME", Ser. No. 10/037,061, filed on Nov. 8, 2001, entitled "RJ MODULAR CONNECTOR HAVING SUBSTRATE HAVING CONDUCTIVE TRACE TO BALANCE ELECTRICAL COUPLINGS BETWEEN TERMINALS" and Ser. No. 10/037,706, filed on Dec. 29, 2001, entitled "RJ MODULAR CONNECTOR HAVING SUBSTRATE HAVING CONDUCTIVE TRACE TO BALANCE ELECTRICAL COUPLINGS BETWEEN TERMINALS", all invented by James H. Hyland. Copies of the specifications are hereto attached.

BACKGROUND OF THE INVENTION

1. Field of the Invention

The present invention relates to a modular jack, and particularly to a modular jack having an improved grounding plate so as to ensure a reliable signal transmission especially occurred in high speed.

2. Description of Prior Art

U.S. Pat. No. 5,069,641, issued to Sakamoto on Dec. 3, 1991, discloses a modular jack assembly in which a choke coil and terminals are soldered to an internal circuit board. This internal circuit board subassembly is then encased in an insulative housing. The insulative housing comprises a base, a lid and two internal chambers. The internal circuit board subassembly is mounted in one chamber which is separated by a separator from the other chamber adapted to receive a plug connector. The lid is attached to encase the internal circuit board subassembly. As suggested by Sakamoto, the electronic parts needed in high speed application are mounted onto an internal circuit board first to become a subassembly. Additional ground connection is needed in high speed application. More electronic components should be mounted onto the board and some of them need ground.

Hence, an improved modular jack is required to overcome the disadvantages of the prior art.

BRIEF SUMMARY OF THE INVENTION

An object of the present invention is to provide a modular jack having a magnetic module with a grounding plate received therein so as to provide a reliable signal transmission.

A modular jack in accordance with the present invention comprises an insulative housing defining a cavity for receiving a plug connector, a conductive shield substantially surrounding the insulative housing and a module assembly received in the cavity of the insulative housing. The module assembly comprises a magnetic module, a first printed circuit board (PCB), a second PCB and a grounding plate. A contact array is soldered to the first PCB. The first PCB is attached on a bottom wall of the magnetic module. The second PCB carries capacitors and resistors and a pair of light emitting diodes (LEDs) soldered on a front portion thereof. The second PCB is attached on a top wall of the magnetic module. The magnetic module defines a passage and the grounding plate has a flat portion received therein.

Other objects, advantages and novel features of the invention will become more apparent from the following detailed description of the present embodiment when taken in conjunction with the accompanying drawings.

DETAILED DESCRIPTION OF THE INVENTION

Figure 1:
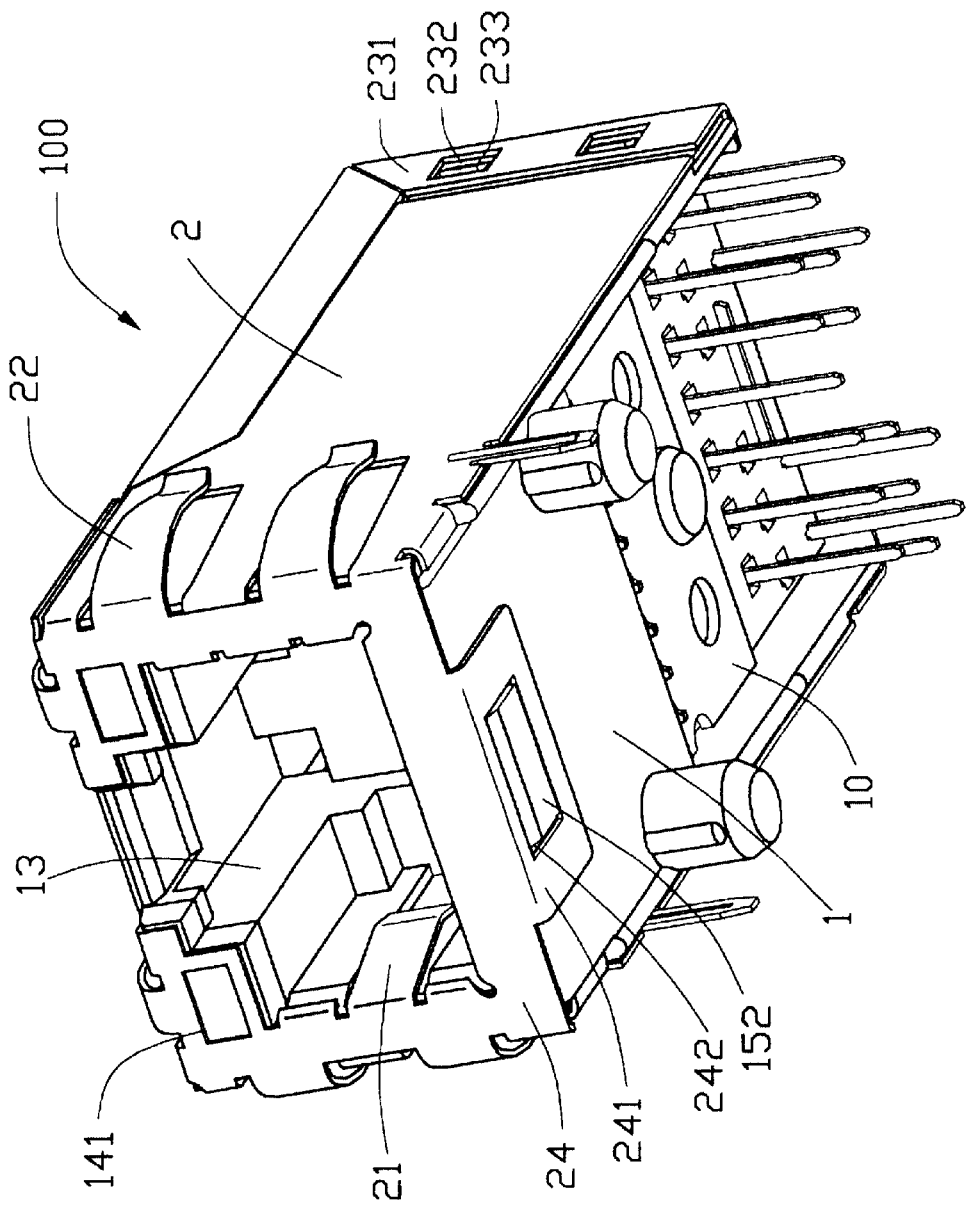
FIG. 1 is a perspective view of a modular jack in accordance with the present invention.

Referring to FIG. 1, a modular jack 100 for being mounted on a main printed circuit board (PCB, not shown) in accordance with the present invention comprises an insulative housing 1, a conductive shield 2 substantially surrounding the insulative housing 1 and a module assembly 10 installed in the insulative housing 1.

Figure 2:
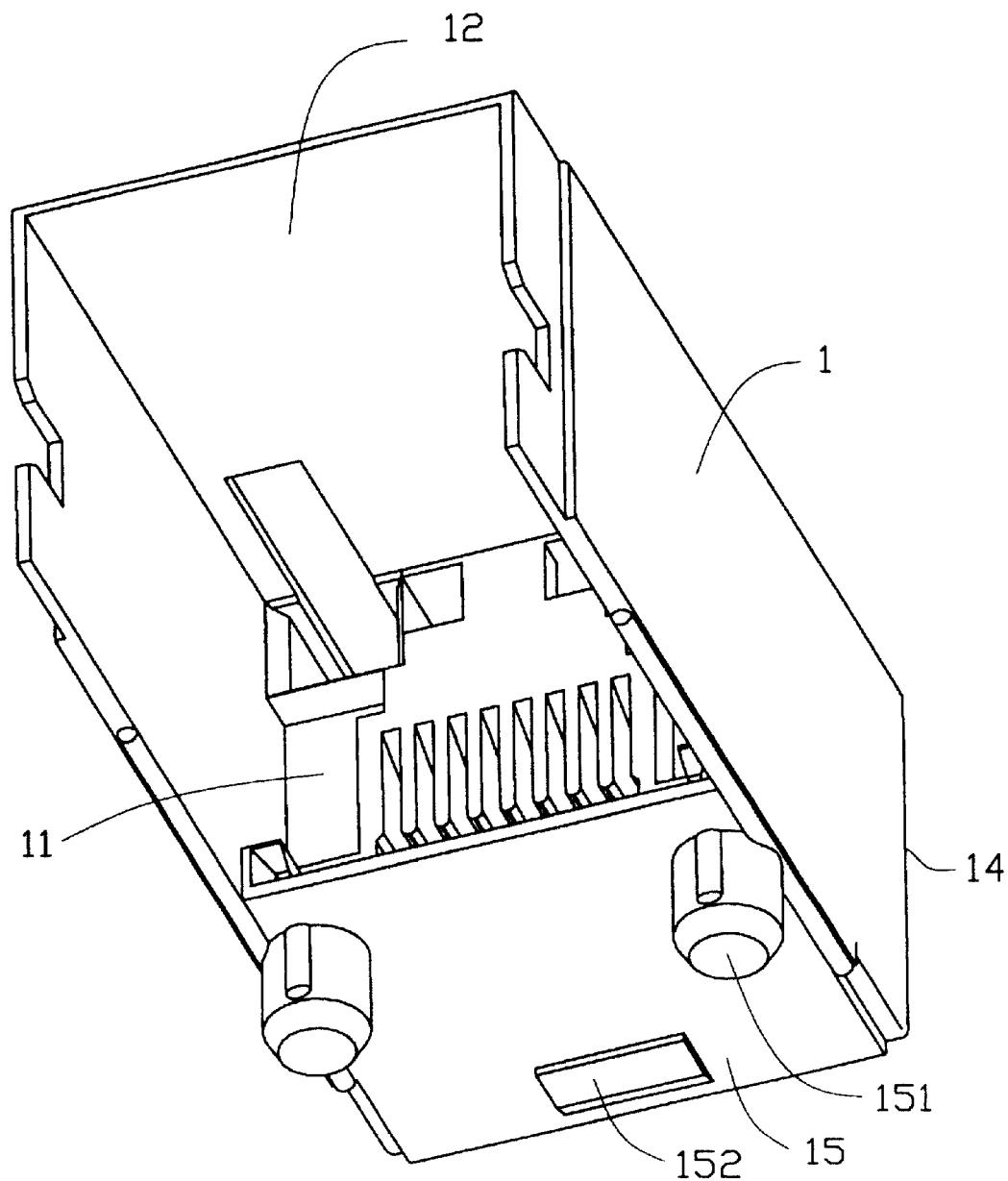
FIG. 2 is a perspective view of an insulative housing of the modular jack shown in FIG. 1.

Referring to FIGS. 1 and 2, the insulative housing 1 has a separator 11 which divides an interior space of the insulative housing 1 into a front chamber 13 and a rear chamber 12. The front chamber 13 receives a complementary plug (not shown). The rear chamber 12 receives the module assembly 10. The housing 1 has a front wall 14 and a bottom wall 15. The front wall 14 defines a pair of light emitting diode (LED) receiving cavities 141 extending therethrough. The bottom wall 15 has two locating posts 151 formed thereon, and a wedge 152 formed on a front portion thereof.

The shield 2 has a plurality of flexible fingers 21 which are bent into the front chamber 13 for engaging with an outer shield of the complementary plug. The shield 2 also has a plurality of outwardly bent flexible fingers 22 for engaging with an appropriate support structure (not shown) within which the modular jack 100 may be mounted. The shield 2 has a pair of side walls (not labeled), a front shield wall 24 and a rear shield wall (not labeled). Each side wall forms a pair of wedges 233 on a rear portion thereof and the rear shield wall has a pair of flaps 231 each defining a pair of slots 232 engaging with corresponding wedges 233 of the side walls of the shield 2. The front shield wall 24 has a bottom flap 241 defining a slot 242 engaging with the wedge 152 of the housing 1 to secure the shield 2 to the housing 1.

Figure 3:
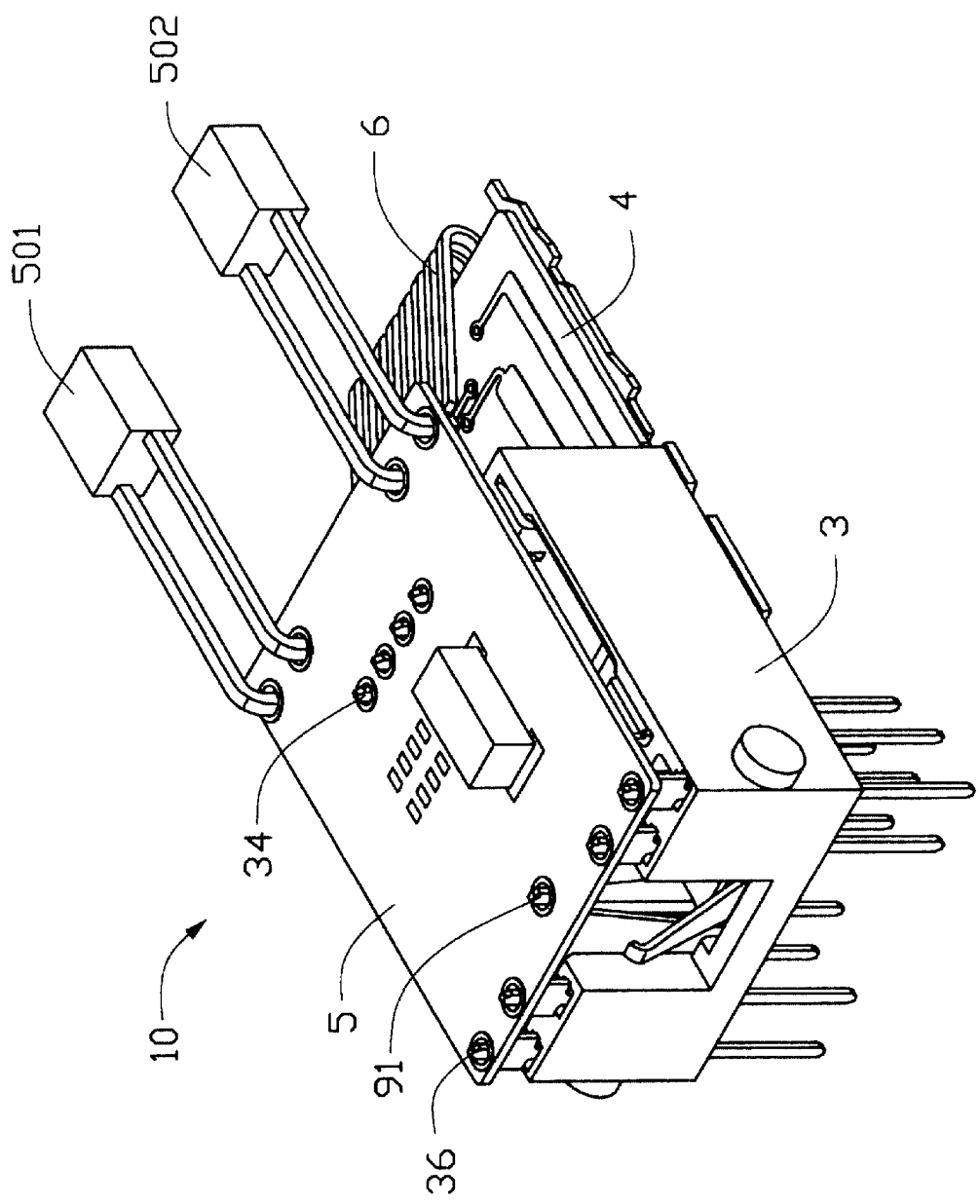
FIG. 3 is a perspective view of a module assembly of the modular jack shown in FIG. 1.
Figure 4:
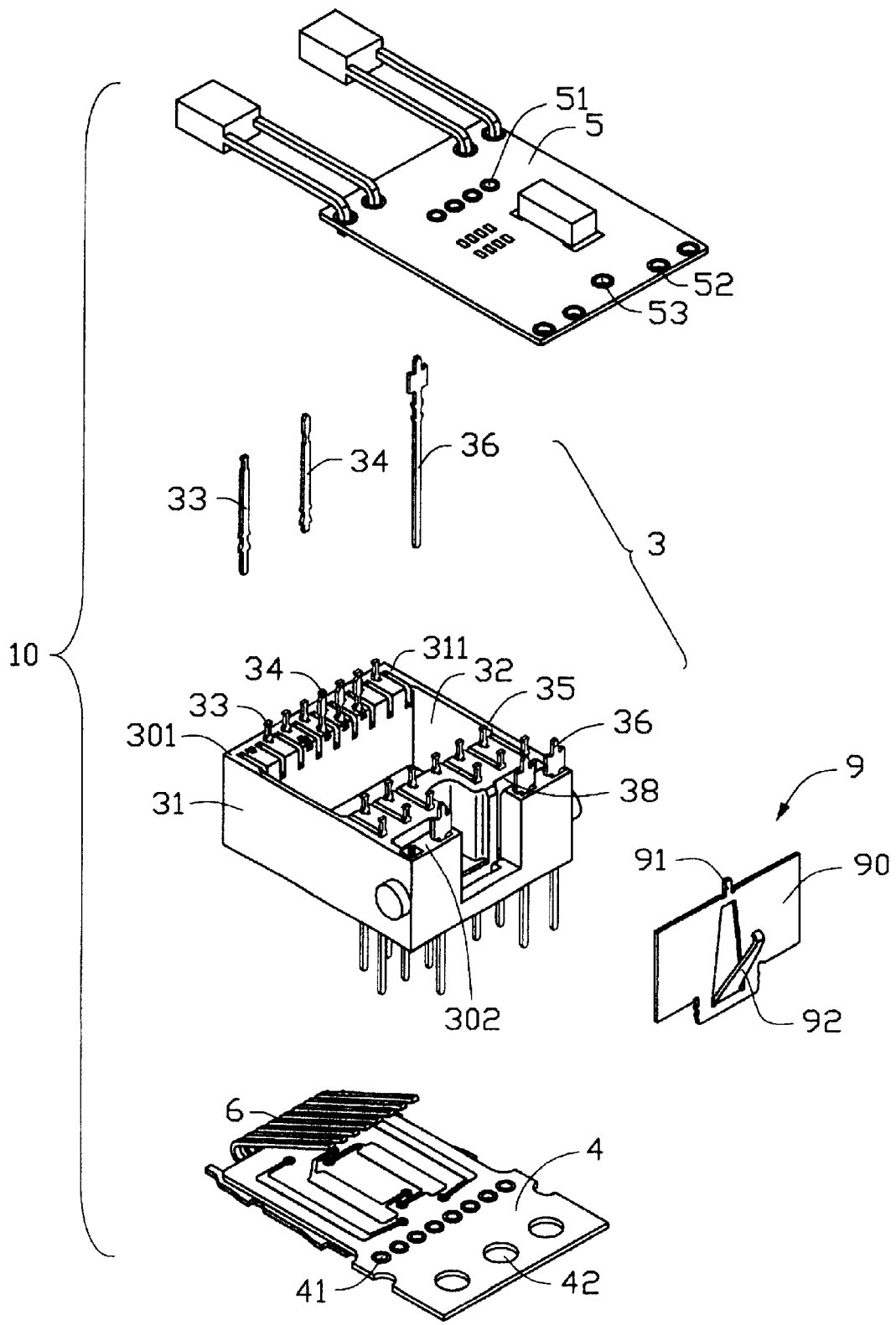
FIG. 4 is an exploded view of FIG. 3.
Figure 5:
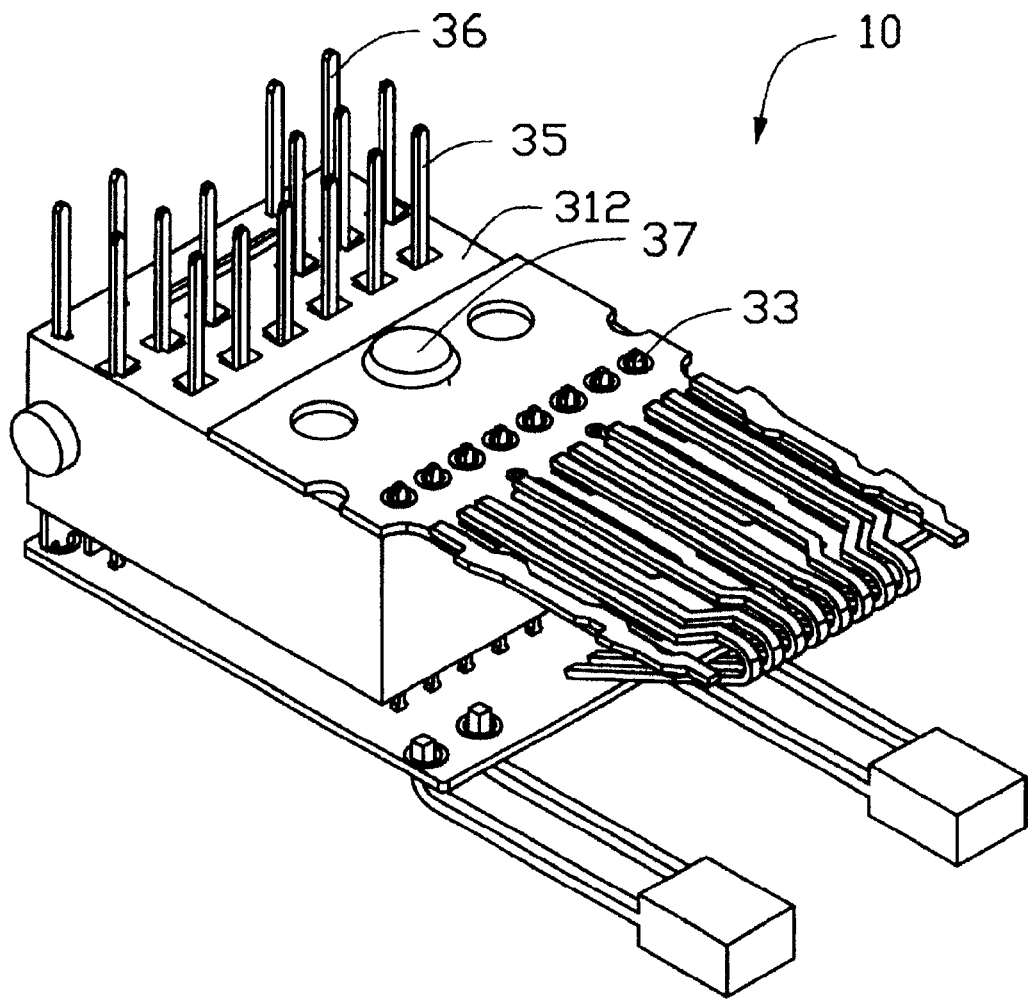
FIG. 5 is another perspective view of FIG. 3 taken from a bottom aspect.

Referring to FIGS. 3, 4 and 5, The module assembly 10 comprises a magnetic module 3, a first PCB 4, a second PCB 5, a contact array 6, a pair of LEDs 501, 502 and a grounding plate 9. The contact array 6 is soldered to the first PCB 4. The first PCB 4 has a plurality of first soldering holes 41 and a holding hole 42 defined in a rear portion of the first PCB 4.

The second PCB 5 carries capacitors (not labeled), resistors (not labeled) and the LEDs 501, 502 soldered thereon. The second PCB 5 also has a plurality of second soldering holes 51 adjacent to the LEDs 501, 502. A plurality of third soldering holes 52 are defined in a rear portion of the second PCB 5. A grounding hole 53 is defined between second soldering holes 51 and third soldering holes 52.

The magnetic module 3 has an insulative base 31. The base 31 has a top wall 311 and a bottom wall 312. A cavity 32 for housing magnetic coils (not shown) is defined in the base 31 and opens in the top wall 311. The cavity 32 divides the top wall 311 into a front side 301 and a rear side 302. A plurality of first pins 33 are fixed in the front side 301 and extend through top and bottom walls 311, 312 of the base 31. A plurality of second pins 34 which are longer than the first pins 33 are fixed adjacent to the first pins 33. A plurality of first terminals 35 and second terminals 36 which are longer than the first terminals 35 extend through the rear side 302 of the base 31. A passageway 38 for receiving the grounding plate 9 is defined in the rear side 302. A post 37 is formed on a middle portion of the bottom wall 312 and extends downwardly therefrom.

The grounding plate 9 has a flat portion 90 and a soldering portion 91 formed on a top edge of the flat portion 90. The soldering portion 91 is to be positioned in the grounding hole 53 of the second PCB 5 before the second PCB is soldered to the pins 33, 34 of the magnetic module 3. A connection beam 92 is bent rearwardly from the flat portion 90 and contacts the rear shield wall of the shield 2.

In assembly, The first PCB 4 is attached on the bottom wall 312 of the magnetic module 3 by soldering the plurality of first pins 33 to the first soldering holes 41 and inserting the post 37 into the holding hole 42. The contact array 6 is soldered on the first PCB 4. The first PCB 4 cantilevers forward from the base 31. The second PCB 5 is disposed off from the top wall 311 of the magnetic module 3 by inserting pins 34, terminals 36 and soldering portion 91 of the grounding plate 9 into respective holes 51, 52 and 53. The module assembly 10 is installed into the housing 1 so that the magnetic module 3, the first PCB 4 and the second PCB 5 are received in the rear chamber 12. The two LEDs 501, 502 and the contact array 6 extend into the front chamber 13 through separator 11. The two LEDs 501, 502 are inserted into corresponding LED receiving cavities 141. The contact array 6 electrically contacts terminals of the complementary plug, and the terminals 35, 36 fix the modular jack 100 on the main PCB and electrically connect proper circuit traces on the main PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A modular jack comprising:

a housing defining a cavity for receiving a plug connector;

a shielding member surrounded the housing;

a terminal insert received in the cavity, the terminal insert having a noise suppressing module mechanically and electrically connected between top and bottom printed circuit boards (PCBs); and a grounding member attached to the noise suppressing module, the grounding member having a top protrusion connecting with a circuit trace of the top PCB and a flexible connection beam contacting with a rear wall of the shielding member; wherein the noise suppressing module is a magnetic module.

2. The modular jack as described in claim 1, wherein the top PCB carries capacitors, resistors and a pair of light emitting diodes(LEDs) soldered on a front portion thereof.

3. The modular jack as described in claim 1, wherein the magnetic module defines a cavity for receiving a plurality of magnetic coils.

4. The modular jack as described in claim 1, wherein the bottom PCB has a plurality of terminal contacts soldered thereon, and the top PCB has two LEDs soldered thereon.

5. The modular jack as described in claim 4, wherein the housing defines a front chamber and a rear chamber, the noise suppressing module attached with the top PCB and a rear portion of the bottom PCB, are stalled in the rear chamber, and the two LEDs and front contact portions of the terminal contacts extend into the front chamber.

6. A modular jack comprising:

a housing defining a cavity for receiving a plug connector;

a shielding member surrounded the housing;

a terminal insert received in the cavity, the terminal insert having a noise suppressing module mechanically and electrically connected between top and bottom printed circuit boards (PCBs); and a grounding member attached to the noise suppressing module, the grounding member having a top protrusion connecting with a circuit trace of the top PCB and a flexible connection beam contacting with a rear wall of the shielding member; wherein the noise suppressing module is a magnetic module, said noise suppressing module having an insulative base, the insulative base including a mounting post extending downwardly from a bottom surface of the base and adapted to be mounted on a mother board.

7. A housing defining a cavity for receiving a plug connector;

a shielding member surrounded the housing;

a terminal insert received in the cavity, the terminal insert having a noise suppressing module mechanically and electrically connected between top and bottom printed circuit boards (PCBs);

the noise suppressing module including a first set of terminals electrically connecting to a contact array soldered on the bottom PCB;

a second set of terminals positioned behind said first set of terminals and electrically connecting to a pair of LEDs soldered on top of the PCB; and a grounding member attached to the noise suppressing module, the grounding member having a top protrusion connecting with a circuit trace of the top PCB and a flexible connection beam contacting with a rear wall of the shielding member; wherein the noise suppressing module is a magnetic module and the grounding member is located between said first set and second set of terminals.

* * * * *